United States Patent [19]

Matsuda et al.

[11] Patent Number: 5,883,533
[45] Date of Patent: Mar. 16, 1999

[54] CLOCK SIGNAL GENERATING DEVICE HAVING A REDUNDANT CONFIGURATION

[75] Inventors: Osamu Matsuda, Tokyo; Hideo Nogami, Miyagi, both of Japan

[73] Assignee: NEC Corporation, Tokyo, Japan

[21] Appl. No.: 721,615

[22] Filed: Sep. 26, 1996

[30] Foreign Application Priority Data

Sep. 26, 1995 [JP] Japan ..................................... 7-247702

[51] Int. Cl.⁶ ................................ H03L 7/06; H04L 7/00
[52] U.S. Cl. ............................................ 327/156; 375/376
[58] Field of Search ..................................... 327/145, 146, 327/147, 155, 156, 298, 99, 115; 331/17; 375/373, 375, 376, 326, 327, 328, 371

[56] References Cited

U.S. PATENT DOCUMENTS

| | | | |
|---|---|---|---|
| 5,194,828 | 3/1993 | Kato et al. | 331/1 A |
| 5,455,840 | 10/1995 | Nakauchi et al. | 327/156 |
| 5,497,126 | 3/1996 | Kosiec et al. | 327/156 |
| 5,574,757 | 11/1996 | Ogawa | 327/156 |
| 5,673,004 | 9/1997 | Park | 327/156 |
| 5,682,112 | 10/1997 | Fukushima | 327/147 |

FOREIGN PATENT DOCUMENTS 63-299543  12/1988  Japan .
3-98345    4/1991   Japan .
4-57536    2/1992   Japan .
4-142829   5/1992   Japan .
4-208733   7/1992   Japan .
5-83238    4/1993   Japan .
5-268204   10/1993  Japan .
8-32567    2/1996   Japan .
8-46601    2/1996   Japan .
8-172380   7/1996   Japan .

Primary Examiner—Timothy P. Callahan
Assistant Examiner—My-Trang Nu Ton
Attorney, Agent, or Firm—Scully, Scott, Murphy and Presser

[57] ABSTRACT

A clock signal generating device of the present invention has an active and a spare clock selecting circuit. The two clock selecting circuits each includes a selector for selecting one of a plurality of outside timing signals and outputting it as an inside clock signal under the control of a controller. A PLL (Phase Locked Loop) circuit is commonly connected to the outputs of the active and spare selecting circuits. The PLL circuit reduces the influence of switching between the active and spare selecting circuits and switching between the outside timing signals. The PLL circuit includes a hold-over circuit for temporarily holding, in response to a control signal fed from the controller, a signal output from the selecting circuit.

4 Claims, 4 Drawing Sheets ns,533

CLOCK SIGNAL GENERATING DEVICE HAVING A REDUNDANT CONFIGURATION

BACKGROUND OF THE INVENTION

The present invention relates to a clock signal generating device and, more particularly, to a clock signal generating device having a redundant configuration.

There has been extensively used a clock signal generating device capable of generating a clock signal for use in a utility apparatus in synchronism with a timing signal fed from the outside of the apparatus. This kind of device is disclosed in, e.g., Japanese Patent Laid-Open Publication No. 5-83238 (document 1) or No. 4-57536 (document 2). The devices taught in documents 1 and 2, however, have a problem that when an active and spare scheme is adopted, the system becomes sophisticated and expensive, as will be described specifically later.

SUMMARY OF THE INVENTION

It is therefore an object of the present invention to provide a simple and inexpensive clock signal generating device.

A clock generating device of the present invention has an active and a spare selecting circuit each for selectively receiving a plurality of outside timing signals from the outside, and outputting an inside clock signal different in frequency from the outside timing signals. A PLL circuit is commonly connected to the outputs of the active and spare selecting circuits, and has a hold-over function for avoiding the influence of the inside clock signal ascribable to switching between the outside timing signals and switching between the active and spare selecting circuits. An output controller controls the active and spare selecting circuits and PLL circuit.

Preferably, the active and spare selecting circuit each has a selector for selecting one of the outside timing signals, a frequency divider for dividing the frequency of the outside timing signal selected by the selector, and an interface for outputting the output of the frequency divider as an inside clock signal.

Further, the PLL circuit preferably has a phase comparator for comparing the phase of the inside clock signal fed from one of the active and spare selecting circuits and the phase of a system clock signal output from the PLL circuit, and outputting a phase error information signal representative of a difference between the two phases. An AC-to-DC converter converts the phase error information signal to a DC component to thereby output phase error voltage information. A hold-over circuit outputs, in response to a control signal fed from the output controller and continuously for a preselected period of time, a DC voltage corresponding to the phase error information signal appeared just before the arrival of the control signal. A voltage controlled oscillator outputs the system clock in response to a control signal output from the hold-over circuit. A frequency divider divides the frequency of the system clock signal to thereby feed the resulting clock signal to the phase comparator.

BRIEF DESCRIPTION OF THE DRAWINGS

The above and other objects, features and advantages of the present invention will become apparent from the following detailed description when taken with the accompanying drawings in which.

In the drawings, identical reference numerals denote identical structural elements.

DETAILED DESCRIPTION OF THE PREFERRED EMBODIMENT

To better understand the present invention, a brief reference will be made to conventional clock signal generating devices, shown in FIGS. 1 and 2.

Figure 1:
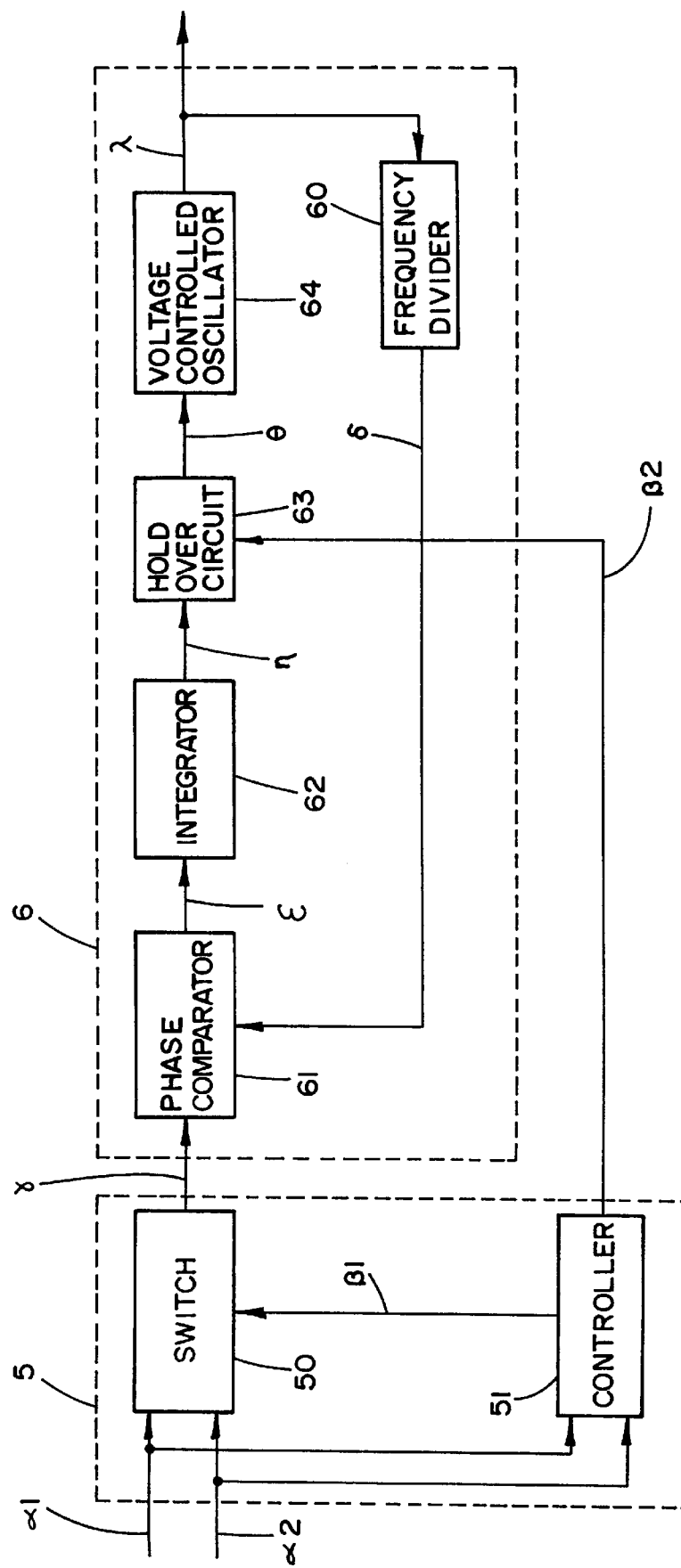
FIGS. 1 and 2 are block diagrams each showing a particular conventional clock signal generating device.

A clock signal generating device shown in FIG. 1 corresponds to the previously mentioned document 1. As shown, a first and a second timing signal $\alpha 1$ and $\alpha 2$, respectively, received from the outside or host station are input to a switching circuit 50. If the first timing signal $\alpha 1$ is normal, the switching circuit 50 selects it and delivers a corresponding timing signal $\gamma$ to a phase comparator 61. A VCO (Voltage Controlled Oscillator) 64 outputs a clock signal $\lambda$ while a 1/N frequency divider 60 divides it by N to output a clock signal $\delta$. The clock signal $\delta$ is also applied to the phase comparator 61. The phase comparator 61 produces a signal $\epsilon$ representative of a difference in phase between the timing signal $\gamma$ and the clock signal $\delta$ and feeds it to an integrator 62. The integrator 62 transforms the input signal $\epsilon$ to a DC voltage $\eta$ corresponding to the difference in phase between the signals $\gamma$ and $\delta$. The DC voltage $\eta$ is fed to a hold-over circuit 63. The hold-over circuit 63 holds the DC voltage $\eta$ for a moment and then delivers it to the VCO 64 as an oscillator control voltage $\theta$. In response, the VCO 64 generates the clock signal $\lambda$ whose phase corresponds to the oscillator control voltage $\theta$. The clock signal $\lambda$ is applied to the frequency divider 60 and fed to circuitry needing a clock via an output terminal. The frequency divider 60 divides the input clock signal l by N and feeds the resulting clock signal $\delta$ having the same period as the timing signal $\gamma$ to the phase comparator 61.

If the first timing signal $\alpha 1$ is faulty, then a switch, not shown, included in the switching circuit 50 selects the second timing signal $\alpha 2$ in response to a switch control signal $\beta 1$ output from a controller 51. At this instant, in response to a hold-over control signal $\beta 2$ also output from the controller 51, the hold-over circuit 63 locks its output $\theta$ at the voltage appeared before the arrival of the control signal $\beta 2$. As a result, the clock signal $\lambda$ output from the VCO 64 maintains its frequency appeared before the switching from the timing $\alpha 1$ to the timing $\beta 2$.

At the next timing, the switching circuit 50 feeds the second timing signal $\alpha 2$ to the phase comparator 61 as a timing signal $\gamma$. In response, the hold-over circuit 63 unlocks the oscillator control voltage $\theta$ in response to the next hold-over control signal $\beta 2$ and resumes its usual operation. At this time, the integrator 62 receives the signal $\epsilon$ representative of a difference in phase between the timing signal $\alpha 2$ and the clock signal $\delta$, and in turn outputs a DC voltage $\eta$ corresponding to the signal $\epsilon$. The DC voltage $\eta$ is fed to the hold-over circuit 63. As a result, a PLL (Phase Locked Loop) 6 consisting of the circuits 60–64 resumes its original PLL mode operation.

When both the first and second timing signals $\alpha 1$ and $\alpha 2$ are normal, the controller 51 is controlled from the outside to output the switch control signal $\beta 1$. In this case, the controller 51 also controls the hold-over circuit 63 in order to lock it at the existing output voltage $\theta$. At the next timing, the controller 51 unlocks the hold-over circuit 63. Consequently, the fluctuation of the frequency of the clock signal $\lambda$ output from the VCO 64 is reduced.

Further, when both the timing signals α1 and α2 are shut off, the controller 51 locks the output DC voltage of the hold-over circuit 63 until either the timing signal α1 or the timing signal α2 has been recovered. As a result, the VCO 64 generates a stable clock signal λ for a certain period of time. This maintains the clock frequency appeared just before the shut-off of the timing signals α1 and α2.

Figure 2:
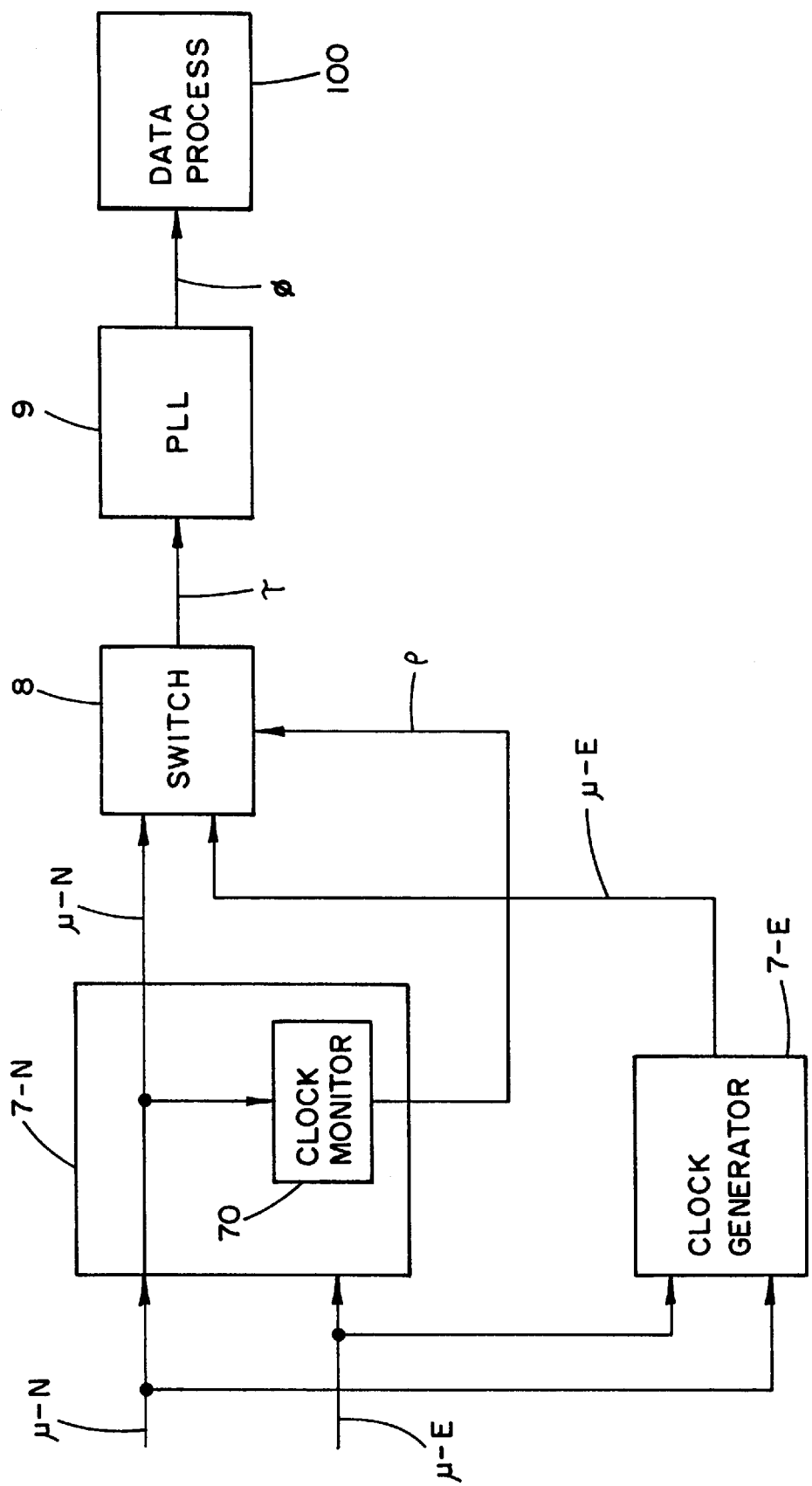

FIG. 2 shows another conventional clock signal generating device taught in the previously mentioned document 2. As shown, an active and a spare clock signal γ generating section 7-N and 7-E, respectively, are each supplied with an active and a spare basic clock signal μ-N and μ-E. The clock signal generating sections 7-N and 7-E each has a respective PLL circuit for generating a master clock signal μ-N or μ-E. The master clock signals μ-N and μ-E have a frequency of, e.g., 78 MHz. A clock monitor 70 is built in the active clock signal generating section 7-N in order to monitor the master clock μ-N being output from the section 7-N. When the master clock signal μ-N is continuously shut off for more than a preselected period of time, e.g., 50 milliseconds, the clock monitor 70 feeds a switch control signal ρ to a switch 8, determining that an error has occurred in the generating section 7-N. The master clock signals μ-N and μ-E output from the two generating sections 7-N and 7-E, respectively, are input to the switch 8. Usually, the switch 8 selects the active master clock signal μ-N as a master clock signal τ. On receiving the switch control signal ρ, the switch 8 selects the master clock signal μ-E output from the spare generating section 7-E. A PLL 9 outputs a system clock φ synchronous to and identical in frequency with the input master clock signal τ. The PLL 9 has thereinside two 1/n frequency dividers, a VCO, a low pass filter and a phase comparator arranged in a feedback loop configuration although not shown specifically. Even when the master clock signal τ is interrupted or practically shut off, the low pass filter functions to generate the system clock signal φ of the same frequency as the master clock signal τ if the interruption or shut-off occurs within a self-running time. A data processing circuit 100 receives the system clock signal φ from the PLL 9. The data processing circuit 100 may be implemented as a digital circuit for multiplexing a group of lower order data, not shown, input thereto to thereby output a group of higher order data.

The problem with the above active and spare scheme is that it complicates the construction and increases the cost of the clock signal generating device, as mentioned earlier.

Figure 3:
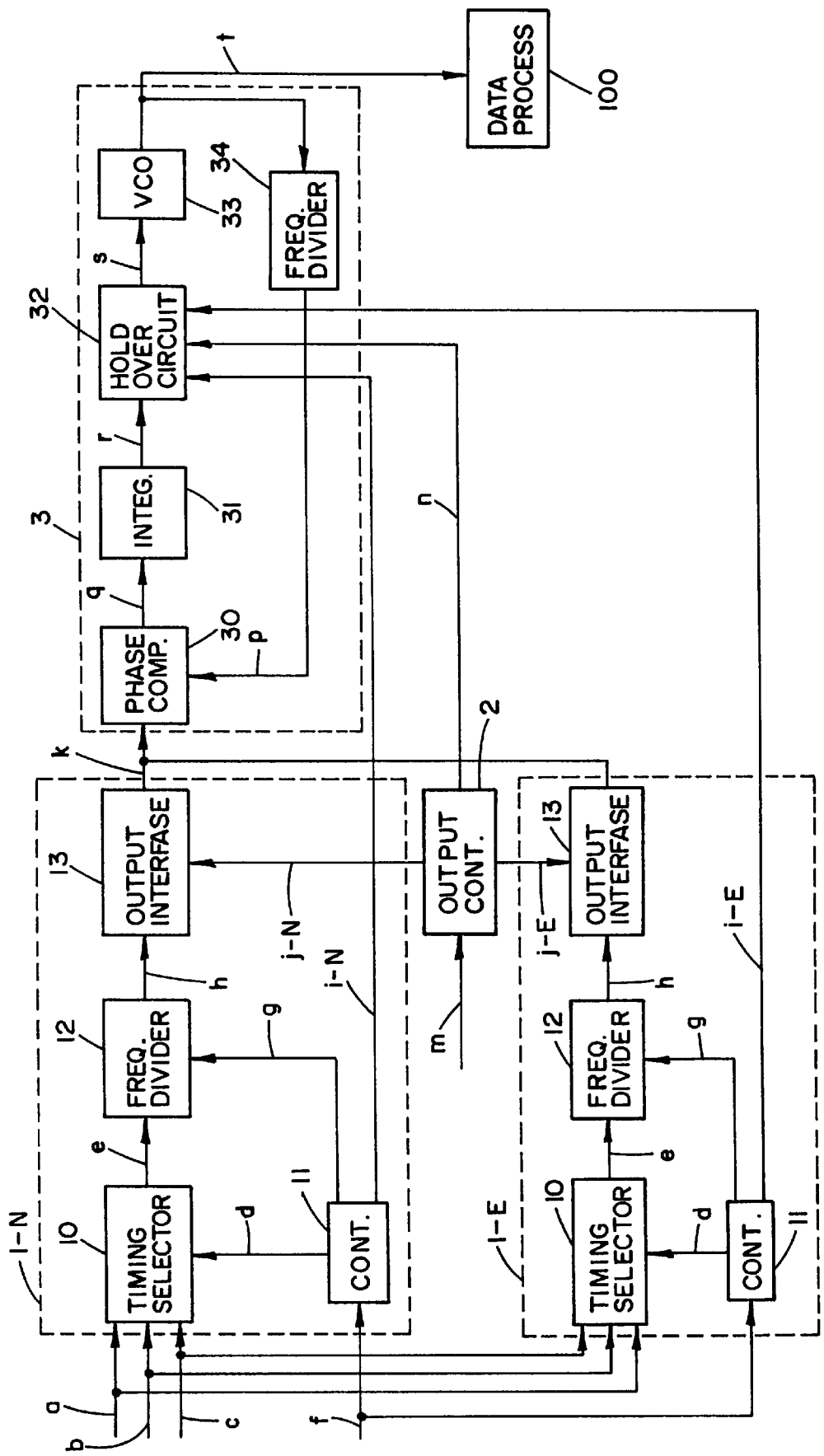
FIG. 3 is a block diagram schematically showing a clock signal generating device embodying the present invention.

Referring to FIG. 3, a clock signal generating device embodying the present invention will be described. As shown, the device is generally made up of an active and a spare clock selecting unit 1-N and 1-E, respectively, and a PLL unit 3. The active clock selecting unit 1-N has a timing selector 10, a controller 11, a frequency divider 12, and an output interface 13. Three timing signals a, b and c each having a particular frequency are input to each timing selector 10 from the outside or host station. The timing selector 10 selects one of the timing signals a, b and c in response to a selection control signal d fed from the controller 11 and feeds it to the frequency divider 12 as an outside timing signal e. The controller 11 outputs the selection control signal d in response to a control signal f input from the host station or from within the system. Further, the controller 11 outputs an active hold-over control signal i-N and a division ratio set signal g at the same time as it outputs the selection control signal d. In response to the division ratio set signal g, the frequency divider 12 divides the frequency of the timing signal e by a divisor corresponding to the timing signal a, b or c selected, thereby outputting an inside clock signal h. The output interface 13 outputs the clock signal h as a system clock signal k in response to an output switch control signal j-N. The spare clock selecting unit 1-E is identical in construction with the active clock selecting unit 1-N and will not be described specifically in order to avoid redundancy.

An output controller 2 is controlled by a control signal m fed from the outside of the device. In response, the output controller 2 feeds the clock output switch control signal j-N to the active clock selecting unit 1-N or feeds a clock output switch control signal j-E to the spare clock selecting unit 1-E, thereby causing the unit 1-N or 1-E to output the system clock signal k. Further, the output controller 2 outputs a hold-over control signal n at the same time as it outputs the above control signal j-N or j-E.

The PLL unit 3 has a phase comparator 30, an integrator 31, a hold-over circuit 32, a 1/N frequency divider 34, and a VCO 33. The phase comparator 30 compares a system clock signal p, which will be described, and the clock signal k output from the clock selecting unit 1-N or 1-E and outputs a digital phase error information signal q representative of a difference in phase between them. The integrator 31 integrates the information signal q with, e.g., a low pass filter and outputs a DC voltage or voltage information r. The hold-over circuit 32 holds, in response to a hold-over control signal n fed from the output controller 2 and for a preselected period of time, an oscillator control voltage s at a voltage corresponding to the information r appeared just before the appearance of the clock output switch control signal j-N or j-E. The VCO 33 is controlled by the oscillator control voltage s to output a system clock signal t. The system clock signal t is applied to a data processing section 100 and the 1/N frequency divider 34. The 1/N frequency divider 34 divides the frequency of the system clock signal t by a preselected value N such that it becomes identical with the frequency of the clock signal k. The output of the frequency divider 34 is input to the phase comparator 30 as the above-mentioned system clock p.

In operation, the timing signals a, b and c input from the outside and each having a particular frequency are input to the timing selectors 10 of the active and spare clock selecting units 1-N and 1-E. Each timing selector 10 selects one of the timing signals a, b and c in response to the selection control signal d fed from the controller 11. Which of the timing signals a, b and c should be selected is indicated by the control signal f which may be fed from the outside or from within the system. Specifically, the control signal f designates intended one of the signals a, b and c for any particular purpose or selects one of them in place of another when the latter is shut off, as the case may be. Which of such two conditions is selected depends on the operating conditions of the entire system. While the timing selector 10 feeds the timing signal e, the frequency divider 12 divides it in order to output a clock signal h having a preselected frequency needed within the device. Specifically, the controller 11 outputs the frequency division ratio information g, i.e., the ratio in period between the timing signal e and the clock signal h to the frequency divider 12 at the same time as it feeds the selection control signal d to the timing selector 10. The output interface 13 determines, in response to the control signal j-N or j-E output from the output controller 2, whether or not to output the clock signal h received from the frequency divider 12 as a clock signal k generated in its own unit. Specifically, when the system and the device are entirely normal, the control signal m input to the output controller 2 causes the controller 2 to output the clock received from the active unit at first. More specifically, the output controller 2 renders the output interface 13 of the clock selecting unit 1-N conductive and thereby causes the inside unit output from the frequency divider 12 to be delivered as the clock signal k. Likewise, the output controller 2 renders the clock selecting unit 1-E nonconductive and thereby inhibits the clock signal h output from the output interface 13 of the unit 1-E from being delivered as the clock signal k. When an error occurs in the active clock selecting unit 1-N due to some cause, clock shut-off detecting means, not shown, included in the system feeds the control signal m to the output controller 2. In response, the output controller 2 shuts off the output of the output interface 13 of the active clock selecting unit 1-N while allowing the output of the output interface 13 of the spare clock selecting unit 1-E to be delivered. The output controller 2 performs the above procedure not only when an error occurs in the clock selecting unit 1-N or 1-E, but also when the control signal m is intentionally input from the outside in order to, e.g., replace either one of the units 1-N and 1-E for maintenance or similar purpose.

The detection of the shut-off of, e.g., the clock signal k ascribable to the shut-off of any of the timing signals a, b and c or an error occurred in the clock selecting unit 1-N or 1-E and specific means for implementing it are not shown or described. In the illustrative embodiment, the output interfaces 13 are both assumed to be built in the associated clock selecting units 1-N and 1-E and implemented by, e.g., tristate buffers. Alternatively, the output interfaces 13 may be respectively positioned outside of the clock selecting units 1-N and 1-E and implemented as selectors or switches. In such a case, each selector or switch will directly receive the clock signal h from the associated frequency divider 12 and will be controlled in the above-described manner by the output controller 2. Further, in the illustrative embodiment, the clock signal k is assumed to be longer in period than the timing signals a, b and c, so that the signals a, b and c have their frequencies divided. Alternatively, the period of the clock signal k may be shorter than the period of the timing signals a, b and c and may be produced by multiplying each of the timing signals a, b and c. This can also be done with the configuration shown in FIG. 3 only if each frequency divider 12 is replaced with a multiplier.

Generally, some protection means is necessary in the event when the timing selector 10 selects one of the timing signals a, b and c and when the output interface 13 turns on or turns off the clock output k. Otherwise, momentary shut-off, jitter and other noises would occur in the timing signal e and clock signal k at the moment of switching. If the clock signal with such noises k is directly fed to the data processing section 100, then data errors or similar errors will occur in the section 100 during data processing. Moreover, assume that the timing signals a, b and c are received from the outside via a transmission channel. Then, the signals a, b and c have their periods and waveforms effected by disturbance, pulse-like noise and others particular to the channel. This in turn effects the clock signal h, i.e., the clock signal k and thereby aggravates the faulty data processing of the data processing section 100.

In FIG. 3, the arrangement of the PLL unit 3 is a solution to the above problem. As shown, the clock signal k output from the clock selecting unit 1-N or 1-E is input to the phase comparator 30. The system clock signal p output from the frequency divider 34 is also fed to the phase comparator 30. The phase comparator 30 outputs the phase error signal q representative of a difference in phase between the clock signals k and p. Generally, if the clock signals k and p are different in phase, the signal q is output in the form of a digital signal of the clock period. Therefore, the signal q is applied to the integrator 31 which is usually implemented as a low pass filter. The integrator 31 transforms variation in the phase difference to variation in a DC voltage while suppressing the high frequency components of the signal q, thereby outputting the information r. The VCO 33 varies the frequency of its output or system clock signal t in accordance with variation in the oscillator control voltage s. As a result, the system clock signal t applied to the data processing section 100 remains stable. The information or DC voltage r output from the integrator 31 fluctuates due to, e.g., the disturbance to the period or the waveform of the clock signal k ascribable to noises. In light of this, the PLL unit 3 causes the frequency divider 34 to divide the system clock signal t to the same frequency as the clock signal k and feeds back the resulting system clock signal p to the phase comparator 30. Consequently, the system clock signal t is stabilized within a preselected period of time. That is, the time constant of the integrator 31 is preselected such that the system clock signal t converges to a stable frequency within a period of time necessary for the data processing section 100 to maintain normal data processing. However, as for the variation of the DC voltage ascribable to the momentary shut-off of the clock signal k, it is necessary to increase the time constant of the integrator 31 if the shut-off continues for a relatively long period of time. The increase in the time constant of the integrator 31 makes it difficult for the system clock t to converge to the stable frequency within the above period of time. The hold-over circuit 32 is the implementation for solving this problem.

The hold-over circuit 32 holds, in response to the hold-over control signal i-N, i-E or n, the DC voltage of the oscillator control voltage s having been output just before the arrival of the hold-over control signal. Stated another way, the time constant of the integrator 31 delays the influence of momentary shut-off ascribable to the switching of the timing signal in the timing selector 10 and that of the clock signal k in the output interface 13. Therefore, if the hold-over control signal i-N or i-E and hold-over control signal n are output at the same time as the controller 11 and output controller 2 respectively output the timing selection control signal d and clock output switching control signal j-N or j-E, the hold-over circuit 32 holds, before the oscillator control voltage s is influenced by the momentary shut-off of the timing signal e or the clock signal k, the DC voltage of the voltage s appeared just before the momentary shut-off.

As stated above, even when the clock selecting unit having a timing signal switching function is provided with redundancy and switches clock signals, it is possible to output the stable system clock signal t only if PLL means with a holdover function is commonly connected to both the outputs of redundant switching means. This makes it needless to provide each of the clock selecting units 1-N and 1-E with a PLL function and a hold-over function.

Figure 4:
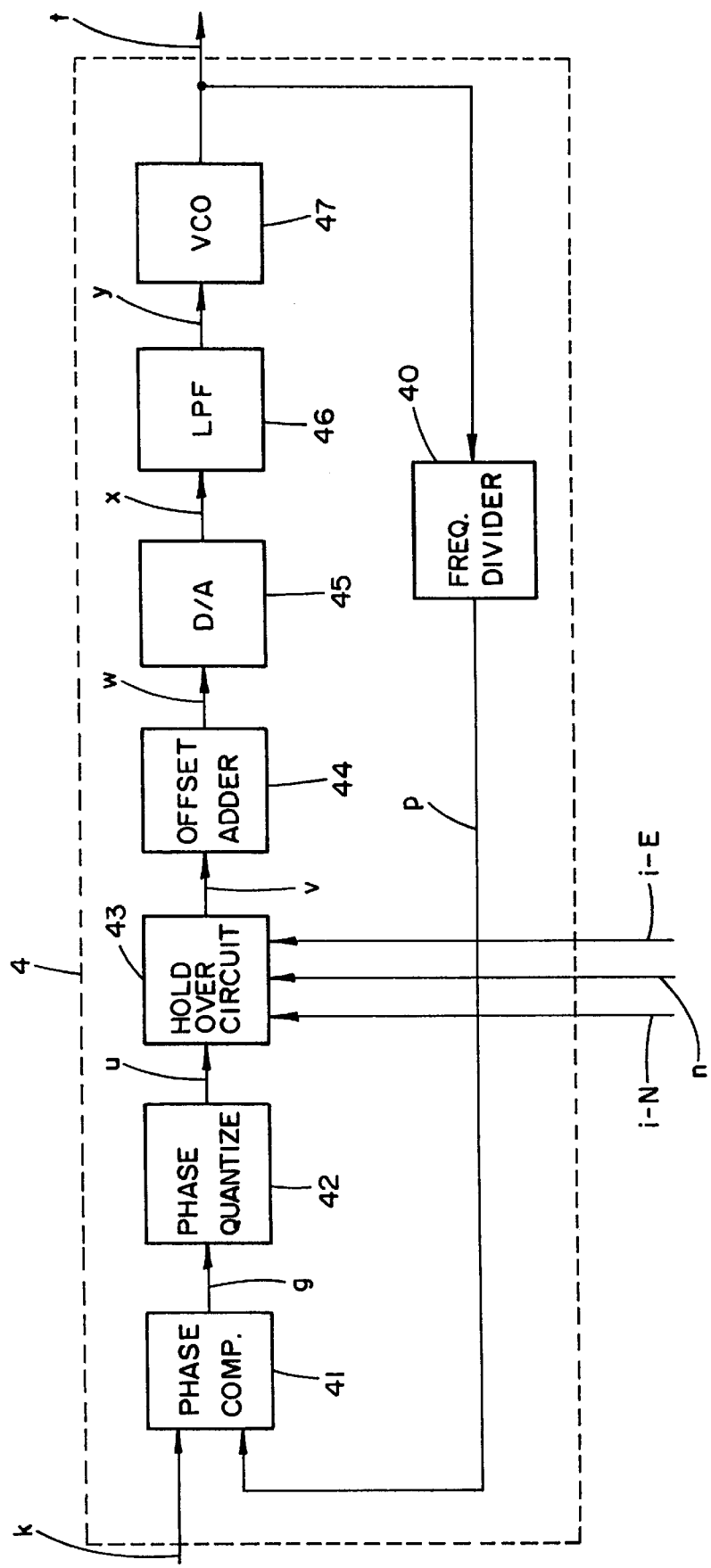
FIG. 4 is a schematic block diagram showing an essential part of an alternative embodiment of the present invention.

FIG. 4 shows an alternative arrangement of the PLL unit. As shown, the PLL unit, generally 4, has a phase comparator 41. The phase comparator 41 compares the phase of the clock signal k and that of the frequency-divided system clock signal p and outputs the information signal q representative of a difference between them. A quantizer 42 transforms the phase difference signal q to digital data and outputs the resulting information signal u. A hold-over circuit 43 outputs, when none of the hold-over control signals i-N, i-E and n is input thereto, the information signal u as an information signal v in accordance with the variation of the signal u. When any one of the hold-over control signals i-E, i-E and n is input to the hold-over circuit 43, the circuit 43 continuously outputs the signal v corresponding to the signal u appeared just before the arrival of the hold-over control signal for a preselected period of time. An offset adder 44 adds offset data to the quantized phase comparison data of the signal v and outputs the resulting information signal w. A digital-to-analog converter (DAC) 45 transforms the information signal w to analog data and outputs it as an analog information signal x. A low pass filter (LPF) 46 converts the information signal x to a DC voltage and outputs it as an oscillator control voltage y. A digital temperature control VCO (DTCXO) 47 outputs, in response to the oscillator control voltage y, the system clock pulse t of preselected frequency to be fed to the outside. A 1/N frequency divider 40 divides the system clock signal t by a preselected divisor N and thereby provides it with the same frequency as the clock signal k. The resulting output of the frequency divider 40, i.e., the system clock signal p is fed to the phase comparator 41.

For example, the inside clock signal k has a frequency of 8 kHz while the frequency divider 40 has a divisor N of 1,620. The phase comparator 41 is implemented as, e.g., a set-reset type phase comparator and compares the phases of the clocks signals k and p and outputs the resulting phase error information signal q as a digital signal. Specifically, if the phases of the clock signals k and p are different, the information signal q is output in the form of a pulse train having the clock frequency. The quantizer 42 transforms the duty of the pulse train to, e.g., ten-bit digital data. More specifically, the quantizer 42 equally divides one period of the above pulses, i.e., ⅛ kHz=125 msec into 1,024 by a 8.912 MHz clock signal, not shown, fed from within the system, and quantizes the high-level portions of the pulses. The hold-over circuit 43 fixes the frequency of the system clock signal t at the frequency appearing before a momentary shut-off occurs in the timing signal or the clock signal k. Specifically, the hold-over circuit 43 samples and latches, eight times at the intervals of 125 msec, the values of the quantized phase difference information appeared X (sec) before. When the hold-over control becomes active, the hold-over circuit 43 repeatedly outputs the eight sampled data. The hold-over control is continuously executed until the next timing or the next clock signal after the occurrence of the error has been selected. Further, to minimize the variation of phase on the transition from the hold-over state to the original state, the hold-over control controls the duty of the phase comparison output pulses such that the original state is restored when the duty becomes substantially equal to the quantized value of the duty during hold-over.

The offset adder 44 adds offset data to the quantized phase comparison data received via the hold-over circuit 43 in order to tune the center frequency of the VCO 47. The offset value has ten bits and ranges from −1,023 to 0 by way of example. The DAC 45 is used to transform the digital information output from the offset adder 44 to an analog signal before the digital information is transformed to a DTCXO control voltage. The DAC 45 serves to reduce the drift of the DTCXO control voltage, so that the VCO 47 can operate sufficiently stably against the variation of the power source and that of temperature.

The LPF 46 reduces needless components other than the DTCXO control voltage transformed to a DC voltage. Specifically, after the output of the DAC 45 has been transformed, it is passed through a second-order loop filter and amplified, if necessary, within the filter. The VCO 47 outputs a frequency of 12.96 MHz as the system clock t by being controlled by an outside control voltage, i.e., the oscillator control voltage y output from the LPF 46. The VCO 47 with a built-in temperature compensation circuit maintains an extremely stable oscillation frequency, i.e., achieves a freerun frequency deviation as small as ±4.6 ppm.

Because the clock signal k input to the phase comparator 41 has a frequency of 8 kHz and because the system clock signal t output from the VCO 47 has a frequency of 12.96 MHz, the frequency divide 40 is provided with a division ratio of 8/12,960=1/1,620.

What is claimed is:

1. A clock generating device comprising:

active selecting means and spare selecting means each for selectively receiving a plurality of outside timing signals from outside, and outputting an inside clock signal different in frequency from said plurality of outside timing signals;

PLL means commonly connected to an output of said active selecting means and an output of said spare selecting means and having a hold-over circuit for performing a hold-over function in response to a plurality of control signals received from the active selecting means and the spare selecting means for avoiding an influence of said inside clock signal ascribable to switching between said plurality of outside timing signals and switching between said active selecting means and said spare selecting means; and output control means to output one of said control signals for controlling said active selecting means, said spare selecting means, and said hold-over circuit of said PLL means.

2. A device as claimed in claim 1, wherein said PLL means comprises:

phase comparing means for comparing a phase of said inside clock signal fed from one of said active selecting means and said spare selecting means and a phase of a system clock signal output from said PLL means, and outputting a phase error information signal representative of a difference between said phases;

AC-to-DC converting means for converting said phase error information signal to a DC component to thereby output phase error voltage information;

said hold-over circuit for outputting, in response to one of said control signals fed from said output control means and continuously for a preselected period of time, a DC voltage corresponding to said phase error information signal appeared just before an arrival of said control signals;

voltage controlled oscillating means for outputting said system clock in response to a signal output from said hold-over circuit; and a frequency divider for dividing a frequency of said system clock signal to thereby feed a resulting clock signal to said phase comparing means.

3. A device as claimed in claim 1, wherein said PLL means comprises:

phase comparing means for comparing a phase of said inside clock signal fed from one of said active selecting means and said spare selecting means and a phase of a system clock signal output from said PLL means, and outputting a phase error information signal representative of a difference between said phases;

quantizing means for transforming said phase error information signal to digital data to thereby output a quantized signal;

said hold-over circuit for outputting, in response to one of said control signals fed from said output control means and continuously for a preselected period of time, a DC voltage corresponding to said phase error information signal appeared just before an arrival of said control signals;

offset adding means for adding offset data to said quantized signal to thereby output a corrected quantized signal;

digital-to-analog converting means for converting said corrected quantized signal to an analog signal;

AC-to-DC converting means for converting said analog signal to a DC voltage to thereby output an oscillator control voltage;

voltage controlled oscillating means for outputting said system clock signal by being controlled by said oscillator control voltage; and frequency dividing means for dividing a frequency of said system clock signal and feeding a resulting clock signal to said phase comparing means.

4. A clock generating device comprising:

active selecting means and spare selecting means each for selectively receiving a plurality of outside timing signals from outside, and outputting an inside clock signal different in frequency from said plurality of outside timing signals; and PLL means commonly connected to an output of said active selecting means and an output of said spare selecting means and having a hold-over circuit for performing a hold-over function in response to a plurality of control signals received from the active selecting means and the spare selecting means for avoiding an influence of said inside clock signal ascribable to switching between said plurality of outside timing signals and switching between said active selecting means and said spare selecting means;

wherein said active selecting means and said spare selecting means each comprises:

a selector for selecting one of said plurality of outside timing signals;

a frequency divider for dividing a frequency of the outside timing signal selected by said selector; and an interface for outputting an output of said frequency divider as said inside clock signal.

* * * * *

UNITED STATES PATENT AND TRADEMARK OFFICE
CERTIFICATE OF CORRECTION

PATENT NO. : 5,883,533
DATED : March 16, 1999
INVENTOR(S) : Osamu Matsuda

It is certified that error appears in the above-identified patent and that said Letters Patent is hereby corrected as shown below:

Column 2, Line 47: "$\beta 2$" should read -- $\alpha 2$ --

Signed and Sealed this

Tenth Day of October, 2000

Attest:

Q. TODD DICKINSON

*Attesting Officer*  *Director of Patents and Trademarks*